United States Patent [19]

Quinn

[11] 3,820,153

[45] June 25, 1974

[54] PLURALITY OF SEMICONDUCTOR ELEMENTS MOUNTED ON COMMON BASE

[75] Inventor: Frederic R. Quinn, Red Hook, N.Y.

[73] Assignee: Zyrotron Industries, Inc., South Hackensack, N.J.

[22] Filed: Aug. 28, 1972

[21] Appl. No.: 284,272

[52] U.S. Cl. .........357/81, 317/234 A, 317/234 E, 317/234 H, 357/72, 357/75

[51] Int. Cl. ............................ H01l 5/00, H01l 3/00

[58] Field of Search .............. 317/234, 3, 3.1, 4, 4.1

[56] References Cited

UNITED STATES PATENTS

| | | | |
|---|---|---|---|
| 3,377,525 | 4/1968 | Bradstock | 317/234 A |
| 3,490,141 | 1/1970 | Lesk | 317/234 N |
| 3,708,722 | 1/1973 | Wiles | 317/234 A |

OTHER PUBLICATIONS

Isolated Power Diode Assembly; RCA Technical Notes, No. 841, pages 1 and 2, July 1969.

*Primary Examiner*—Andrew J. James

[57] ABSTRACT

The array comprising a metallic base having a high thermal conductivity which receives a first layer of material having a high thermal conductivity and low electrical conductivity. A plurality of semiconductor elements are mounted on the first layer of material in juxtaposition to each other and a second layer of material having the same characteristics as the first layer of material covers the first layer of material and the semiconductor elements.

A method of fabricating the array of semiconductor elements also is disclosed.

6 Claims, 7 Drawing Figures

PLURALITY OF SEMICONDUCTOR ELEMENTS MOUNTED ON COMMON BASE

This invention relates generally to an array of semiconductor elements and, more particularly, pertains to an array of semiconductor diodes and to a method of fabricating the array.

In many applications it is highly desirable to connect a plurality of semiconductor elements such as diodes in a desired circuit configuration. Normally, where high power capacity is desired, discrete diodes must be utilized along with their attendant problems of providing the necessary heat sink to prevent damage to the semiconductor. Moreover, such discrete diode elements occupy extremely large volumes as compared to their powerhandling capabilities and thereby produce additional problems particularly in applications where space is at a premium, such as in the aeronautical or space field.

While diode chips may be used as an alternative, the power handling capability of the chip is severely limited.

Accordingly, an object of this invention is to provide an improved semiconductor array.

A more specific object of the invention is the provision of a semiconductor array, such as diodes, wherein the elements are in close proximity to each other and therefore occupy a minimum volume.

Another object of the invention resides in the novel details of construction which provide an array of semiconductor elements of the type described which have relatively high power capabilities and cycling capacity while maintaining a relatively low thermal resistance.

Accordingly, a semiconductor array constructed in accordance with the present invention comprises a metallic base having a high thermal conductivity. A first layer of material is received on said base and has a low electrical conductivity and a high thermal conductivity. A plurality of semiconductor elements are mounted on said first layer of material and each of the plurality of semiconductor elements has at least two terminals which extend upwardly from the base. A second layer of material having a low electrical conductivity and high thermal conductivity covers the first layer of material and the plurality of semiconductor elements to provide a compact array of semiconductor elements having relatively high power capabilities.

It is also highly desirable to fabricate a semiconductor array of the type under consideration in as efficient and economial manner as possible.

Accordingly, an object of another aspect of the invention is the provision of a novel method of fabricating the array.

A more specific object of the invention is the provision of a method which insures that the semiconductor elements are always electrically insulated from the heat sink.

Accordingly, the method performed in accordance with the present invention comprises providing a metallic base having a high thermal conductivity and coating the base with a first layer of material which has a low electrical conductivity and a high thermal conductivity. The first layer of material is cured and affixed to the first layer of material is a plurality of semiconductors in juxtaposition to each other with the terminals of the plurality of semiconductor elements extending upwardly from the metallic base. The plurality of semiconductor elements are coated with a second layer of material which similarly has a low electrical conductivity and a high thermal conductivity and the second layer of material is thereafter cured.

Other features and advantages of the present invention will become more apparent from a consideration of the following detailed description when taken in conjunction with the accompanying drawing, in which.

Figure 1:
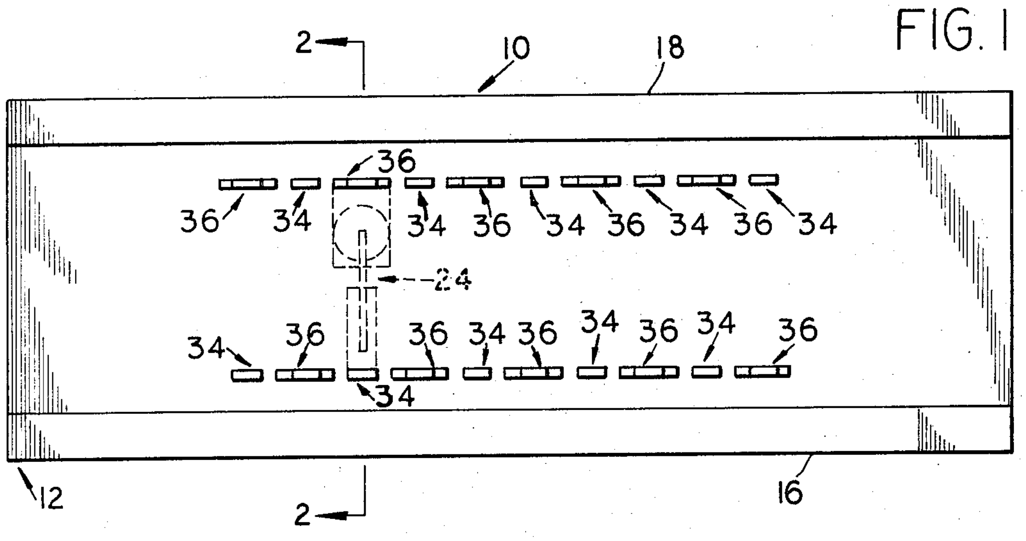
FIG. 1 is a top plan view of an array of semiconductor elements constructed according to the present invention.

An array constructed according to the present invention is illustrated in FIG. 1 and is designated generally by the reference numeral 10. The array 10 includes a base 12 which is fabricated from a material having a high thermal conductivity so that the base 12 operates as a heat sink. In practice, it has been found that a metal such as aluminum operates extremely efficiently as the base 12 in the array of the present invention.

Figure 2:
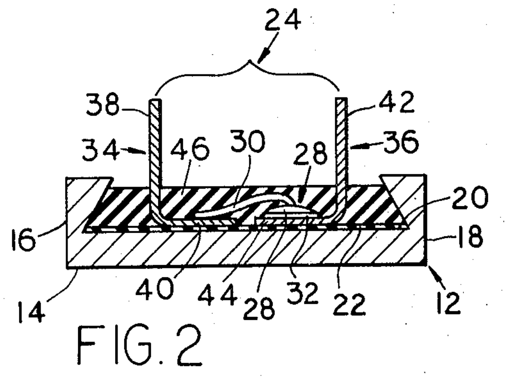
FIG. 2 is a vertical sectional view thereof taken along the line 2—2 of FIG. 1.
Figure 3:
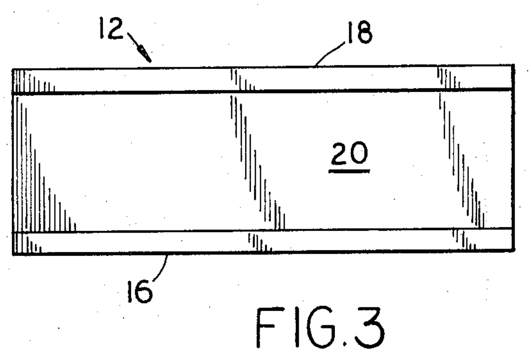
FIG. 3 is a top plan view of the base portion of the array shown in FIG. 1.

More specifically, as shown in FIGS. 2 and 3, the base 12 includes a bottom wall 14 and upstanding opposed longitudinally extending front and rear walls 16 and 18, respectively. As shown in FIG. 2, the inner surfaces of the front and rear walls 16 and 18 taper downwardly and outwardly to the upper surface 20 of the bottom wall 14 so that the base 12 forms a dovetail groove in cross section. As noted in greater detail below, the tapering or sloping inner surfaces of the walls 16 and 18 maintain the heat conducting insulating layers of material in place and prevent the same from separating from the upper surface 20 of the bottom wall 14 of the base.

The upper surface 20 of the bottom wall 14 is coated or covered with a first layer of material 22 (FIGS. 2 and 4) which has a high thermal conductivity but a low electrical conductivity. That is, the layer 22 is fabricated from a material which has exceptionally high heat conducting properties and exceptionally high electrical insulating properties. For example, the thermal conductivity of the layer 22 may be 0.4° C/watt while the electrical conductivity of the material may be 1,000 volts/mil. In practice, the layer 22 is fabricated from a material called zyronite which is manufactured by Zyrotron Industries, Inc., of 600 Huyler Street, South Hackensack, New Jersey, the assignee of the present invention. This material is further disclosed in U.S. Pat. No. 3,413,232 entitled "Heat-Reaction Product Comprising Barium or Molybdenum Sulfides, Metal Phosphates and Metal Dioxides," and assigned to the assignee of the present invention. Thus, the material forming the layer 22 normally is provided in liquid form and is coated on the base 12. Thereafter, the base 12 is inserted into an oven to cure the liquid material to form a solid layer of material. Thereafter, the base and layer may be cooled to room temperature. When a material having the characteristics specified above is used, in practice the layer 22 is made 4 mils thick.

Figure 4:
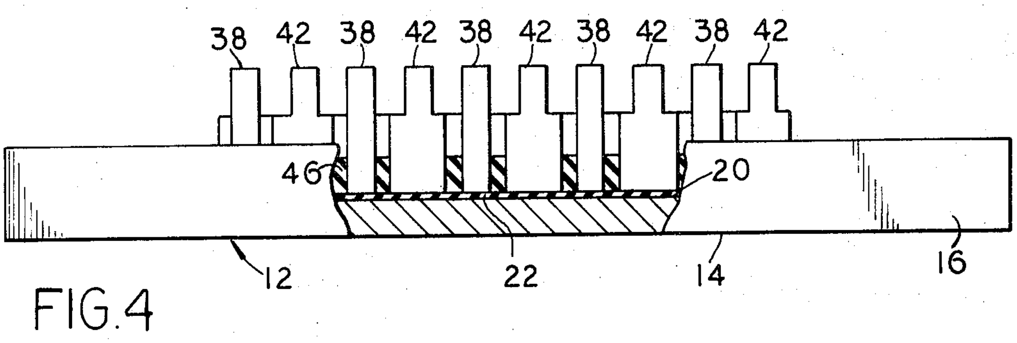
FIG. 4 is a front elevational view, with parts broken away in the interest of clarity, of the array shown in FIG. 1.
Figure 7:
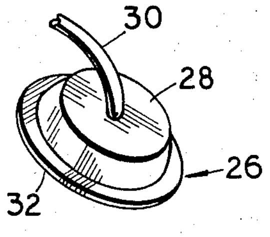
FIG. 7 is a perspective view of a diode chip.

After the layer 22 has been provided on the base 12, a plurality of semiconductor elements 24, as shown in FIGS. 1, 2 and 4, are mounted on the layer 22 in the configuration shown in FIGS. 1 and 4. More specifically, in the preferred embodiment of the present invention, each one of the semiconductor elements 24 includes a diode chip 26 as shown in FIG. 7. The diode chip 26 comprises the semiconductor device 28 having a lead 30 connected to one end and a base 32 connected to the other end. Depending upon the type of chip utilized, the lead 30 may be connected to the anode electrode of the diode 28 and the base 32 may be connected to the cathode electrode of the base. If the diode is of the opposite polarity, it will be obvious that the lead 30 will be connected to the cathode electrode and the base 32 will be connected to the anode electrode. In practice, the diode chips are unpassivated and they are hermetically sealed by coating the chips with the same type of material from which the layer 22 is fabricated and thereafter curing the same.

Figure 6:
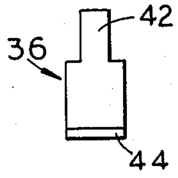
FIG. 6 is a front elevational view of another terminal portion of the array.
Figure 5:
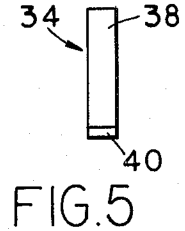
FIG. 5 is a front elevational view of a terminal portion of the array.

The diodes 26 are connected to a pair of terminals which serve to both support the diodes and to conduct electrical signals to the diodes. More specifically, as shown in FIGS. 2, 5 and 6, a pair of terminals 34 and 36 are provided for each one of the diodes 26. The terminal 34 is L-shaped inside elevation and comprises an upstanding or vertical leg 38 and a horizontal bottom leg 40. The lead 30 of the diode 26 is connected to the horizontal leg 40 of the terminal 34 by any conventional means such as soldering or welding the two components together. The terminal 36, as shown in FIG. 6, also includes a vertical or upstanding leg 42 and a horizontal leg 44. The leg 44 is larger in area than the leg 40 and is electrically connected to the base 32 of the diode 26 by any conventional means such as soldering or welding the two components together. Additionally, the lower portion of the leg 42 is enlarged and extends above a second layer of material, as noted in detail below, to indicate the terminal to which the base of the diode 32 is connected.

The semiconductor elements are placed on the layer of material 22 in juxtaposition to each other, as shown in FIG. 1. In practice, ten such elements are provided and they are arranged with the legs 40 and 44 of the terminals extending transverse to the walls 16 and 18. Additionally, alternate terminals are reversed so that the terminals of sequential semiconductor elements will be of opposite polarity so that a terminal 36 will be followed in line by a terminal 34, etc. In a typical arrangement, the width of the leg 44 may be 0.200 inches and the width of a leg 40 of the terminal 34 may be 0.100 inches and the spacing between juxtaposed elements (i.e., between a terminal 36 and a terminal 34) will be approximately 0.050 inches. The entire array of 10 elements may only encompass a spacing of 2.0 inches. The elements initially may be affixed in place by cementing the same on the layer 22. The cement may comprise the same material from which the layer 22 is fabricated.

Thereafter, the diodes 26 and the legs 40 and 44 of each of the semiconductor elements 24 are covered with a second layer of material 46, as shown in FIGS. 2 and 4. The layer 46 may comprise the same material from which the layer of material 22 is fabricated. Accordingly, the material 46 is placed on the semiconductor elements and covers the elements which includes the lower portion of the upstanding legs of the terminals and also covers the layer 22. Thereafter, the array is cured in an oven, assuming the aforementioned material is utilized, and permitted to cool. Thus, the semiconductor elements will be permanently affixed in place after the curing. Thereafter, electrical leads may be connected to the upstanding terminals in any desired manner to obtain a desired circuit configuration of the diode semiconductors.

The layers of material 22 and 46 provide excellent thermal conduction for heat which is dissipated by the diodes to the heat sink or base 12 which dissipates the heat to the environment. Additionally, the layers of material also provide excellent electrical insulation or low conductivity between the semiconductor elements and the metallic base 12 to prevent short-circuiting of the elements. In a typical configuration of the type described above, the outer semiconductor elements carried 7 amps whereas the semiconductor elements in the center of the array carried 25 amps. However, the thermal resistance measured from the junction of the semiconductor diodes to the base was less than 0.4° C/watt. The input signal had a frequency of 25,000 Hz.

Accordingly, a diode array and a method of fabricating the same has been shown and disclosed wherein the array occupies a minimum volume and is highly efficient in operation.

While a preferred embodiment of the invention has been shown and described herein, it will become obvious that numerous omissions, changes and additions may be made in such embodiment without departing from the spirit and scope of the present invention.

What is claimed is:

1. An array of individual semiconductor elements comprising a single metallic base having a high thermal conductivity, a first layer of material on said base having a low electrical conductivity and a high thermal conductivity, a plurality of individual longitudinally spaced semiconductor elements on said first layer of material, each of said plurality of semiconductor elements have at least two laterally spaced terminals extending upwardly from said base, and a second layer of material contiguous with said first layer and having a low electrical conductivity and a high thermal conductivity covering said first layer of material and said plurality of semiconductor elements.

2. An array of semiconductor elements as in claim 1, in which said plurality of semiconductor elements each comprise a diode.

3. An array of semiconductor elements as in claim 2, in which said base includes a bottom wall, and opposed side walls having inner surfaces which taper downwardly and outwardly to define a dovetail groove, said opposed walls extending above said first and second layers of material whereby said first and second layers of material are retained within said groove.

4. An array of semiconductor elements as in claim 3, (in which each one of said plurality of semiconductor elements comprises a pair of terminals,) a semiconductor chip having a lead at one end and a base at the other end, means for electrically connecting said base end to one of said (pair of) two terminals, and means for connecting said lead end to the other of said terminals.

5. An array of semiconductor elements as in claim 4, in which each terminal of said pair of terminals is L-shaped and has a horizontal and a vertical leg, said lead being connected to the horizontal leg of one of said terminals and said base being connected to the horizontal leg of the other of said terminals, said horizontal legs of said pair of terminals being mounted on said first layer of material in spaced relationship to each other with said vertical legs in opposing relationship, one of said vertical legs having a different shape than the other of said vertical legs of said pair of terminals to designate the terminal to which the base of said semiconductor element is connected.

6. An array of semiconductor elements as in claim 5, in which said first and second layers of material are identical in composition.

* * * * *